United States Patent [19]
Kline

[11] Patent Number: 5,402,350
[45] Date of Patent: Mar. 28, 1995

[54] SCHEDULING FOR MULTI-TASK MANUFACTURING EQUIPMENT

[75] Inventor: Paul J. Kline, Richardson, Tex.

[73] Assignee: Texas Instruments Incorporated, Dallas, Tex.

[21] Appl. No.: 722,802

[22] Filed: Jun. 28, 1991

[51] Int. Cl.⁶ .......................................... G06F 15/46
[52] U.S. Cl. .................................. 364/468; 364/478
[58] Field of Search ......... 364/468, 469, 478, 401–403

[56] References Cited

U.S. PATENT DOCUMENTS

| | | | |
|---|---|---|---|
| 4,796,194 | 1/1989 | Atherton | 364/468 |
| 4,866,628 | 9/1989 | Natarajan | 364/468 |
| 4,888,692 | 12/1989 | Gupta et al. | 364/402 |
| 4,896,269 | 1/1990 | Tong | 364/468 |
| 5,099,431 | 3/1992 | Natarajan | 364/468 |
| 5,148,370 | 9/1992 | Litt et al. | 364/468 |
| 5,164,905 | 11/1992 | Iwasaki et al. | 364/468 |
| 5,329,456 | 7/1994 | Kaihara et al. | 364/468 |

Primary Examiner—Roy N. Envall, Jr.
Assistant Examiner—Thomas E. Brown
Attorney, Agent, or Firm—W. Daniel Swayze, Jr.; Leo N. Heiting; Richard L. Donaldson

[57] ABSTRACT

A method of scheduling jobs to be performed by a multi-task workstation in a manufacturing facility, where the multi-task workstation delivers its output to more than one downstream workstation. A scheduler for the multitask workstation categorizes that workstation's job queue according to the type of job and its destination workstation. The scheduler also determines a priority factor for each category, based on the percent of jobs represented by that category, the flow position of jobs in that category, and feedback from that category's downstream workstation. The feedback factor is provided by a work monitor at each downstream workstation that captures data reflecting the current workload, maintains this data to calculate workload averages, and uses the average to compare current workload to workload histories.

21 Claims, 3 Drawing Sheets

SCHEDULING FOR MULTI-TASK MANUFACTURING EQUIPMENT

TECHNICAL FIELD OF THE INVENTION

This invention relates to scheduling equipment use in a manufacturing facility, and more particularly to a method of scheduling equipment having a work queue with more than one type of job to be processed.

BACKGROUND OF THE INVENTION

Semiconductor chip manufacturing is a good example of the use of equipment for "multi-task" processing. The term "chip" refers to a piece of semiconductor material scribed or etched from a semiconductor wafer on which one or more electronic components are formed. The process by which a wafer is transformed into a chip can be conceptualized as a series of discrete process steps, which transform a bare silicon wafer at the first process step to a finished integrated circuit at the last process step. The "frontend" of the fabrication process results in a semiconductor wafer having fully formed integrated circuits thereon. The individual circuits are separated and packaged elsewhere.

These front-end steps are independent of the machines physically located on the factory floor, and are the functional description of what happens to the wafers at each stage of manufacture. Ideally, processing steps should be scheduled in a manner that most efficiently uses the equipment.

A complicating factor in scheduling is that the process steps do not occur as a single "assembly line" string of events. It is sometimes necessary for a single piece of equipment to operate more than once on a wafer. For example, during the fabrication of a single wafer, the diffusion of impurities into selected openings, or windows, in the semiconductor is repeated many times. The process of diffusing these "windows" involves at least four basic steps: mask generation, oxidation, photolithography and etching, and diffusion. For devices such as transistors and diodes, the diffusion is repeated for different layers, such as for the base, emitter, and collector, or for the anode and cathode. Thus, for example, a photolithography machine might be re-used at different layers to produce a single chip. At any one time, the queue of jobs waiting at that machine could include wafers at various stages of manufacture.

Another complicating factor is that multiple process flows may operate in one facility at the same time, such as when a front-end facility has several product lines. Each product line will have different steps for the manufacturing process. A single machine may perform process steps for each product line flow.

Existing scheduling techniques are not designed for such multi-task equipment. They do not perform well for situations in which the same equipment is used multiple times for a single lot. A need exists for an improved scheduling method for multi-task equipment.

SUMMARY OF THE INVENTION

One aspect of the invention is a method for scheduling jobs of a manufacturing facility, which has at least one workstation that is multi-task in the sense that its work queue includes jobs at different phases of manufacture destined for different downstream workstations. The multi-task workstation has a scheduler, which partitions jobs in the job queue of that workstation into categories, such that each job category represents jobs at a comparable stage of manufacture and destined for the same downstream workstation. Then, with respect to each category, the scheduler determines priority factors, which represent that category's percent of total jobs, the flow position of jobs in that category, and feedback from its downstream workstation. The feedback factor comes from data supplied by each downstream workstation, based that station's current and historical workload data. The scheduler then uses the priority factors to determine a priority score for each category, and uses the priority score to select from each next category, jobs to be processed by the multi-task workstation.

A technical advantage of the scheduling method is that it reduces manufacturing cycle time. It is responsive to the dynamic state of a manufacturing facility, especially to shifting bottlenecks caused by conditions such as changing product mix or mechanical breakdowns.

DETAILED DESCRIPTION OF THE INVENTION

Figure 1:
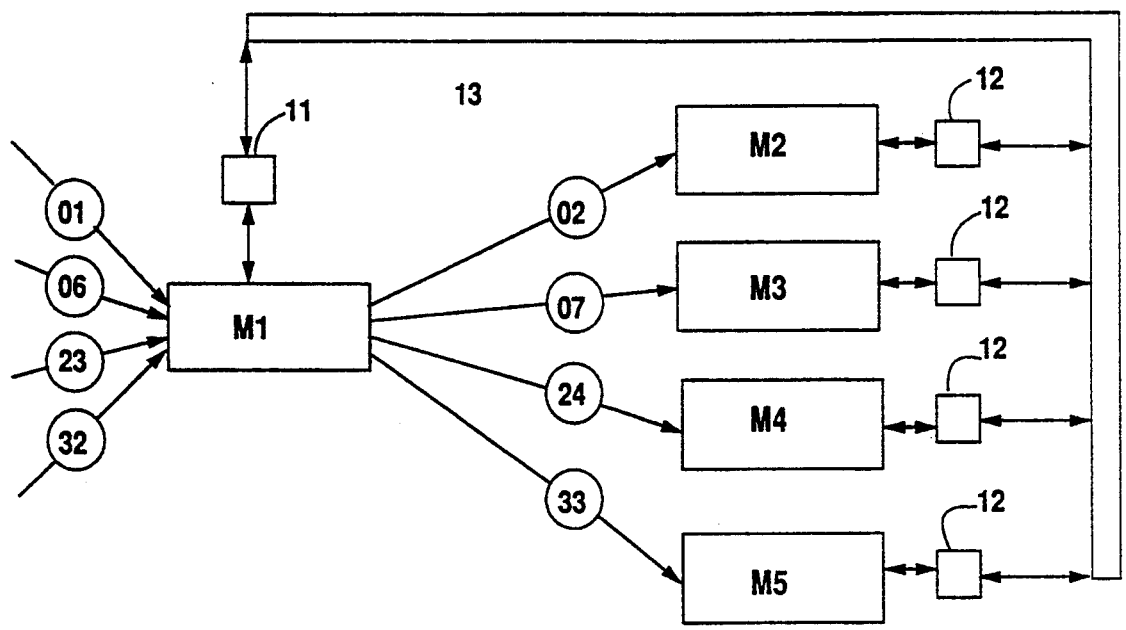
FIG. 1 illustrates a multi-task machine and downstream machines to which its output is delivered.

FIG. 1 illustrates a manufacturing process, in which a single machine, M1, is a "multi-task" machine, in the sense that it operates on jobs at various levels of manufacture. In the example of FIG. 1, the same workpiece is processed by M1 at step 01 of its manufacturing process, and again at steps 06, 23, and 32. After each step of these steps at M1, the workpiece goes to a downstream machine for further processing, i.e., machines M2, M3, M4, and M5. Where a number of workpieces are being produced, M1's work queue at any given time may include step 01 of one workpiece, step 06 of another workpiece, etc.

Although the term "machine" is used herein, the term "workstation" could also be used; it is not necessary for M1 or any other machine to be a single piece of equipment. For example, M1 could be a number of pieces of equipment that perform a certain phase of manufacture.

M1 is in communication with, and its work queue is controlled by, scheduler 11. M2–M5 are each in communication with a work monitor 12. Scheduler 11 determines what jobs in M1's queue will be processed by M1. Work monitors 12 provide feedback to scheduler 11, via communications link 13, for use in making this determination. Scheduler 11 and work monitors 12 are computer systems, programmed as explained below. Each computer system has standard computing equipment, including memory, processing unit, and input and output means. In particular, scheduler 11 has output means for communication scheduling decisions to control apparatus of its associated workstation, and work monitor 12 has input means for receiving workload data and output means for communicating feedback data to its upstream workstation.

An example of a manufacturing process that uses equipment in this manner is semiconductor chip manufacture. A wafer is fabricated by creating a number of patterns, each at a unique mask layer. At each layer, some means for making a pattern, such as oxidation removal, is performed. Theoretically, this oxide removal step could be performed by the same machine, regardless of the particular mask level presently being created. The oxide removal step is followed at some point by a diffusion step, typically by "doping" impurities into silicon.

Figure 2:
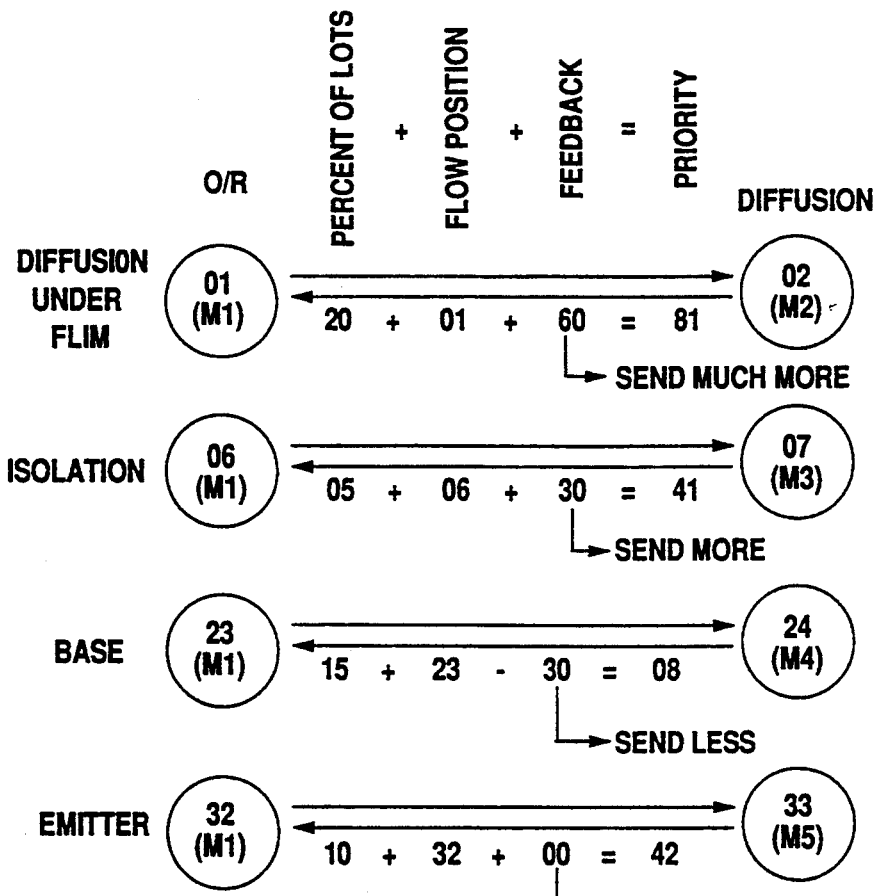
FIG. 2 illustrates four manufacturing levels handled by the multi-task machine of FIG. 1, and the determination of a priority score that includes a feedback value from downstream machines.

FIG. 2 illustrates four mask layers associated with a typical chip manufacturing process: diffusion under the epitaxial film, isolation, base, and emitter. Each mask layer is associated with an oxide removal (O/R) and a diffusion step. FIG. 2 is not intended to represent an entire fabrication process. In real situations, these steps are not necessarily in this order; there may be preceding, intervening, or subsequent steps at each level.

For purposes of example, it is assumed that each of the O/R steps is performed on a single machine, M1. An example of M1 is a photolithographic workstation. However, the diffusion steps are performed on different machines, M2–M5, which are each dedicated to a particular mask layer.

Although FIG. 2 shows M2–M5 as receiving work only from M1, and shows M1 as sending work only to diffusion workstations, this is for purposes of simplicity. In a more complicated example, M2–M5 would receive work from other machines and send work to downstream machines. M1 might send work to workstations other than M1–M5, and M1–M5 may feedback to machines other than M1. An upstream machine may send work to M1 and receive feedback from it. In these more complex configurations, M1–M5 might be both upstream and downstream with respect to other machines, and therefore, might each have a scheduler 11 and a work monitor 12.

Figure 3:
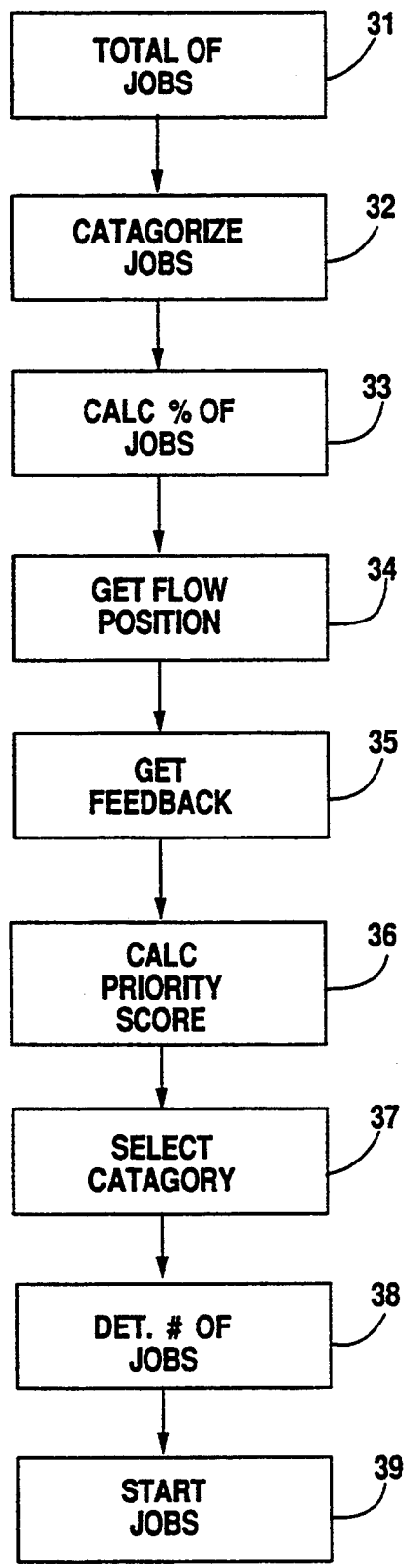
FIG. 3 illustrates the operation of the scheduler of the multi-task machine of FIG. 1.

FIG. 3 illustrates the programming of scheduler 11 to determine the jobs to be processed by M1. Using the semiconductor chip example, each "job" represents a certain number of wafers, i.e. a "lot", to be processed at a particular layer.

As will be explained in further detail below, scheduler 11 is used to prioritize jobs waiting for processing, using a combination of factors. These factors are the percentage of lots queued, the nearness of each job to the end of its process flow, and feedback from the work monitor 12 of each downstream workstation. Scheduler 11 computes these factors and uses them to determine a priority score for each job category. Scheduler 11 then executes a round robin routine to rotate through the categories, using the priority score to determine what jobs will be processed at a given time.

The steps shown in FIG. 3 occur at periodic intervals during the manufacturing process. Some calculations will vary according to current conditions. Thus, as explained below, although flow position is a constant value, the percent of lots and feedback values may vary over time.

Step 31 of the operation of scheduler 11 is determining the total number of jobs waiting to be processed at M1.

Step 32 is categorizing the jobs in M1's job queue according to two criteria: logpoint, or current processing step, and downstream workstation. The categorization may be accomplished by programming scheduler 11 to recognize and monitor codes associated with job types and their destinations.

In the chip manufacturing example of this description, the result of step 32 is a partitioning of M1's job queue into sets of jobs that are at comparable logpoints in their fabrication sequences and are destined for the same downstream workstation. Thus, referring again to FIG. 2, the jobs to be performed by M1 have been partitioned into O/R for four mask levels, diffusion under film, isolation, base, and emitter, which are destined for diffusion at M2, M3, M4, and M5, respectively.

As stated above, a more complicated example might have M1 sending a lot at a certain layer to a workstation other than a diffusion workstation. For example, after O/R at the base layer, the lots may go to a base implant workstation, such that this category of lots would require feedback from the base implant workstation.

Steps 33–35 are determining a priority score by determining three factors. Each of these factors is explained in detail below.

The percent of lots factor is a percentage of the lots in a category with respect to the total number of lots to be processed. Thus, referring to the example of FIG. 2, if M1 has a total of 100 lots to be processed at a particular time, and 20 lots are at the diffusion under film level, that job category has a value of 20% for that factor. As explained above, the four levels shown on FIG. 2 are not all mask levels at M1, thus the percentages on FIG. 2 do not add to 100%.

As indicated on FIG. 2, where scheduler 11 simply adds the factors to determine the priority score, if the percent of lots value is high, the priority score is higher. In general, the more lots of a certain category waiting to be processed at M1, the more preferential the scheduling treatment for that category.

The flow position factor is a constant value for each mask level, representing the nearness of that level to the end of processing for that lot. Thus, since diffusion under film is at the beginning of the fabrication process, its flow position value is 01. The isolation, base, and emitter layers have flow positions value of 06, 23, and 32, respectively. Again, FIG. 2 does not purport to show all mask layers and processing steps, which explains the gaps between the flow position values at the various mask levels.

As indicated on FIG. 2, a high flow position contributes to a higher priority value. Thus, when this factor is used, the closer a lot is to the end of its manufacture, its scheduling treatment tends to be more preferential.

The feedback factor is obtained from data from work monitors 12 at each downstream machine, which keeps track of that machine's workload, in terms of hours of processing. Each work monitor 12 also computes feedback data, which represents its current workload conditions and which it delivers to scheduler 11. U.S. Pat. No. 4,888,692, entitled "Real Time Scheduling System" and assigned to the same assignee as the present application, described the use of feedback in a manufacturing facility, and is incorporated by reference herein.

In general, if a downstream machine has a low amount of available work, it has a high feedback value. Beyond this generalization, various techniques may be used to determine the feedback value.

As an example of determining a feedback value, each work monitor 12 monitors the number of lots sent to, and the number of lots arrived at, that workstation. Using the example of FIG. 2, with respect to feedback from M2 to M1, the number of lots sent to M2 are those lots that have completed processing by M1 and are enroute to M2. The number of lots arrived at M2 are those lots that are ready for a processing step performed by M2. These values are translated into hours of work. For example, if 5 lots have been sent to M2, and M2 requires ⅓ hour to process each lot, the work sent represents 5/3 hours of work. If 30 lots have arrived at M2, the work arrived represents 10 hours of work.

Work monitor 12 then separates the lots arrived into lots in queue and lots in process. This can be accomplished by estimation, where the number of lots and the capacity of M2 in terms of how many lots can be processed simultaneously, are known. Thus, if 30 lots have arrived at M2, and M2 can handle 32 lots, the number of lots in queue is 0 and the number of lots in process is 30. It is assumed that the lots in process are halfway done. Thus, the work arrived at M2 is 15 lots, or 5 hours.

Each work monitor 12 also stores histories of work arrived and work sent data and determines averages from these histories. In the preferred embodiment, each work monitor 12 maintains four histories and computes four workload averages: the average amount of work that currently arrives at all workstations, the average amount of work that historically arrives at all workstations, the average amount of work that arrives at that workstation, and the average amount of work that is sent to that workstation. The determination of averages for all workstations requires that some means of communicating data among work monitors be provided, such as by means of communications link 13.

Work monitor 12 then makes four comparisons, using the current workload values and the workload averages. First, it compares the average amount of work that arrives at that workstation to the average amount of work that arrives at all workstations. Second, it compares the current amount of work that has arrived at that workstation to the average amount of work that arrives at that workstation. Third, it compares the current amount of work that has arrived at that workstation to the average of the current work that has arrived at all workstations. Fourth, it compares the current amount of work that has been sent to that workstation to the average amount of work sent to all workstations.

Using the workload example for M1 set out above, the following values are used for purposes of example:

| | |
|---|---|
| average workload sent to M2 | 3 hours |
| average workload arrived at M2 | 20 hours |
| average historical workload arrived at all machines | 6 hours |
| average current workload arrived at all machines | 5 hours |

Thus, where the work sent to M2 is 5/3 hours and the work arrived at M2 is 5 hours, the four comparisons set out above have the following results:

1) Average local arrived to average overall historical arrived: The average amount of work that arrives at M2 (20 hours) is HIGH relative to the average workload that arrives at all machines (6 hours).
2) Current local arrived to average local arrived: The work that has arrived at M2 (5 hours) is LOW compared to the average work that arrives at M2 (20 hours).
3) Current local arrived to average current overall arrived: The work that has arrived at M2 (5 hours) is AVERAGE compared to the average work that arrives at all machines (5 hours).
4) Current local sent to average local sent: The work sent to M2 (5/3 hour) is AVERAGE compared to the average work sent to M2 (3 hours).

Known statistical methods may be used, including the use of mean and standard deviation values, to evaluate these comparisons. For example, a comparison that is more than one standard deviation above the mean might result in a HIGH value.

After computing the comparisons, work monitor 12 uses the results as input to a decision tree algorithm or lookup table, which returns a feedback value. Alternatively, the decision tree algorithm or look-up table could be stored in scheduler 11, which receives the results of the comparisons made by each downstream work monitor 12.

An advantage of the invention is that the decision tree programming may be easily modified to emphasize certain of the four comparison results. By changing the decision tree, a wide variety of regulation schemes may be implemented. The comparison results may be given various weights, and one or more of the results may be emphasized.

For example, the first comparison, average local arrived to average overall arrived, represents the extent to which a machine is utilized. A HIGH value indicates a highly used machine, and therefore, a potential bottleneck. If the result of this comparison is emphasized, the HIGH history value would result in a call for more work; the feedback value to M1 would contribute to a higher priority value.

Figure 4A:
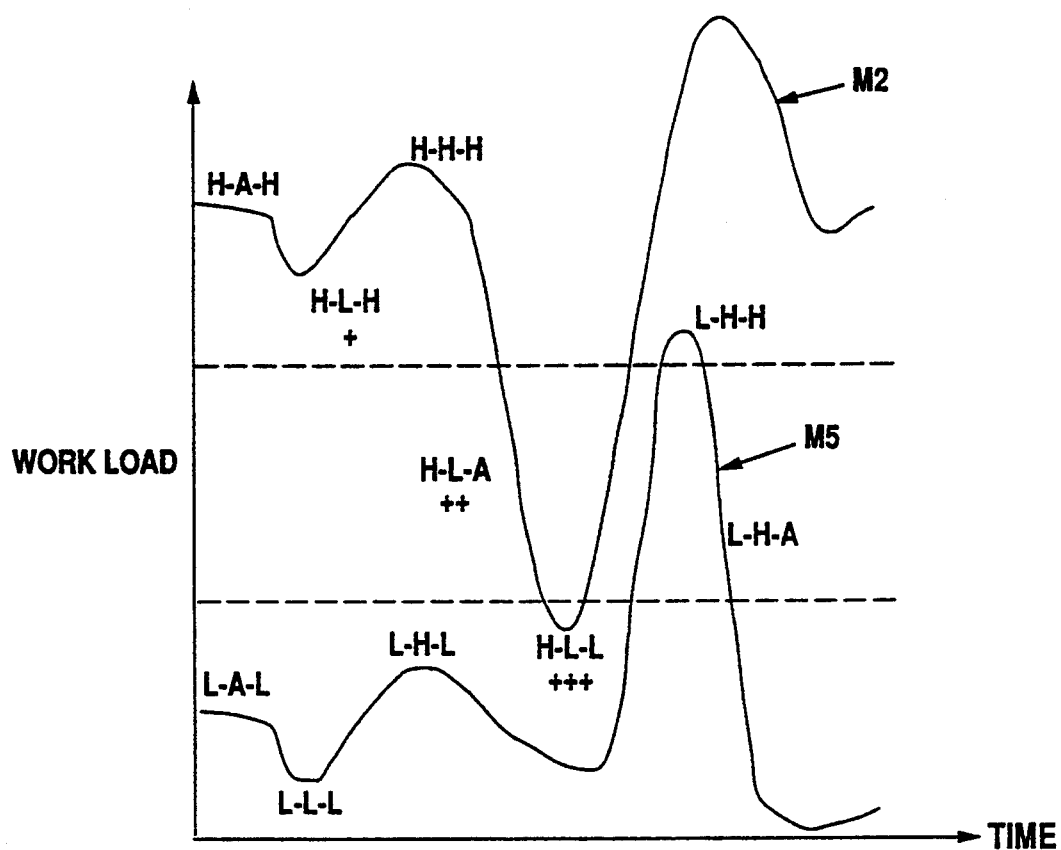
FIGS. 4A and 4B illustrate how a feedback value is determined at each downstream machine.

FIG. 4A illustrates the feedback values for M2, which has a high average utilization, as well as feedback values for another downstream machine, such as M3, which has a low average utilization. The three letters, such as, H-A-H, represent the results of the first three comparisons set out above, which are HIGH, AVERAGE, or LOW. M2 has a consistently high utilization, thus the first letter is always H. It is considered to be a potential bottleneck. In contrast, M5 has low utilization, thus the first letter is always L. Some combination of the three comparison results at any given time, such as by simple addition or otherwise, results in a current workload score.

One feedback scheme that may be implemented with the decision tree is the avoidance of starving bottlenecks. In this scheme, work destined for high usage machines are given a higher priority by upstream machines. For implementing a bottleneck starvation avoidance scheme in the example of FIG. 2, M5 always has a "no adjustment" feedback value. However, M2 has a positive feedback value if the current workload score drops below its average. The value of the feedback depends on the extent of the drop. Thus, at the time when M2 has H-L-H comparison results, its feedback value is + as indicated on FIG. 3. Values of H-L-A and H-L-L result in ++ and +++ values, respectively. Referring to the example of FIG. 2, the + and ++ may translate into the feedback values of 30 and 60, with +++ translating to a feedback value of 90. Although not shown in FIG. 4A, a machine having average utilization could also be given positive feedback values when its current workload score falls below an average value.

Another feedback scheme that may be implemented by programming the decision tree is avoiding doing jobs when they would just sit at their downstream machine. FIG. 4B again illustrates the feedback values for M2, which has a high average utilization, as well as feedback values for M5, which has a low average utilization. Again, the + values indicate a high feedback value, representing a request for more work, which tends to result in a higher priority value. The − values represent a low feedback value, which tends to result in a lower priority. The + values represent times at which the machine does not have much work in queue, and preferential treatment is given to those machines at those times. Positive feedback values are assigned to machines having low average utilization if their current workload is not far above their average workload, and to machines having high utilization when they fall to certain point.

Figure 4B:
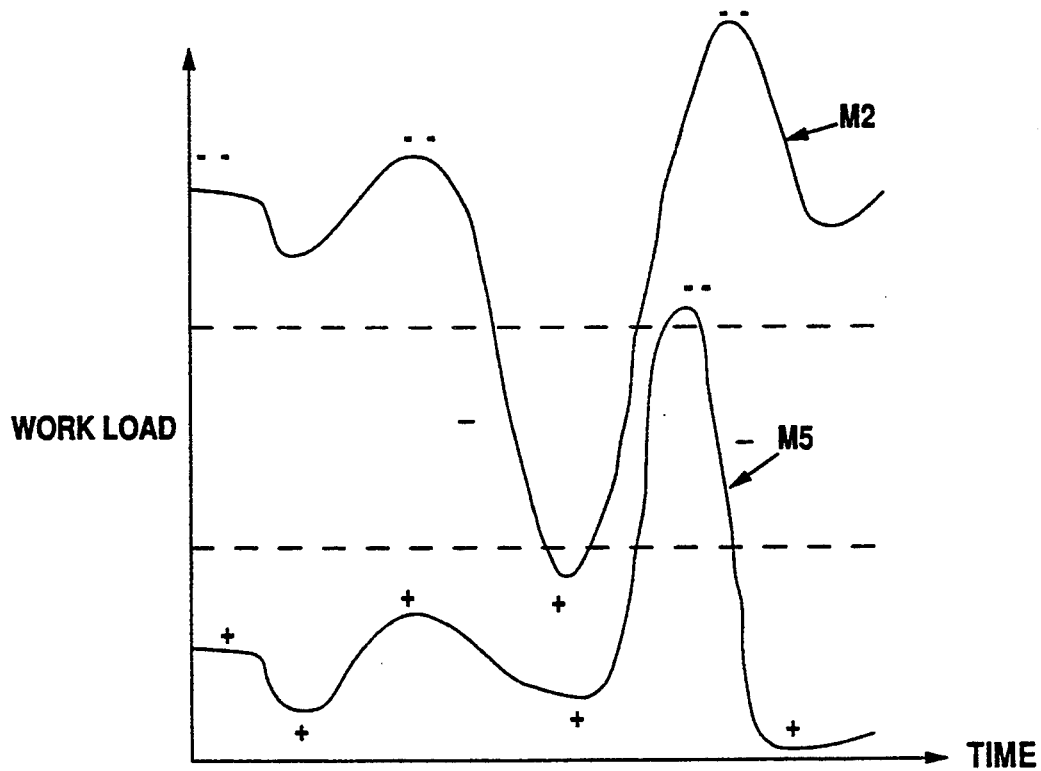

A third feedback scheme for the decision tree is a "smoothing" scheme, which determines the average of each machine's workload curve, such as the workload curves shown in FIGS. 4A and 4B. A positive feedback value is returned to scheduler 11 if the current workload score is less than the average and a negative value if the current workload value is greater than the average.

Any number of different types of schemes may be implemented. Process flow simulations, or experimentation, may be used to determine what feedback values should be assigned to workload values to result in the best performance.

Regardless of the scheme used, some sort of feedback data is returned to scheduler 11, using one or more of the comparisons made by work monitors 12.

Referring again to FIG. 3, step 36 of the operation of scheduler 11 is determining a priority score. This score may be determined by simple addition of the three factors as shown in FIGS. 2 and 3. Alternatively, various weighting factors may be used to affect the impact of one or more factors.

In step 37, after determining a priority score for each job category, scheduler 11 uses a round robin routine to determine what jobs will be processed. The round robin may be implemented in various ways, each of which use the priority value in some manner.

In a first approach, scheduler 11 recommends a number of jobs from each currently selected category, with more jobs being chosen from categories having higher priorities. For example, each category may be associated with a list of pointer values, either Yes or No, with the number of Yes's relative to the number of No's determined by that category's priority score. For example, referring to FIG. 2, when the round robin routine rotates to the category that represents jobs at the diffusion under film O/R stage and destined for M2, the priority value is 81. Thus, the pointer list would have 81% Yes values. Thus, when the round robin routine rotates to that category, it will permit a lot to be scheduled 81% of the time. The routine will bypass the category 19% of the time.

The priority score may also be used to determine whether a category will be passed over, with an upper bound set on the number of times that scheduler 11 will pass over any particular job category. In another implementation, when scheduler 11 rotates to a category, its priority value is used to determine the number of jobs to be processed during that rotation.

In step 39, scheduler 11 communicates the results of its scheduling decision to other control features of the workstation, so that the selected jobs may be started.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for scheduling jobs of a manufacturing facility having at least one multi-task workstation including a work queue having said jobs at different phases of manufacture and for different downstream workstations, comprising the steps of partitioning said jobs in a job queue of said multi-task workstation into job categories, such that each of said job categories represents said jobs at a comparable stage of said manufacture and for the same downstream workstation;

determining priority factors for each of said job categories, said priority factors representing a flow position of said job category and feedback from said downstream workstation corresponding to a current workload of said downstream workstation;

determining a priority score for each of said categories in accordance with said priority factors; and selecting from each of said categories in accordance with said priority score, jobs to be processed by said multitask workstation.

2. The method of claim 1, wherein said step of determining said priority factors includes the step of determining a factor representing a percent of jobs in each of said categories.

3. The method of claim 1, wherein said method further comprises the step of determining said feedback factor by comparing the current workload arrived at said downstream workstation to an average workload arrived at said downstream workstation.

4. The method of claim 1, wherein said method further comprises the step of determining said feedback factor by comparing the average workload arrived at said downstream workstation to an average workload arrived at all of said downstream workstations.

5. The method of claim 1, wherein said method further comprises the step of determining said feedback factor by comparing the current workload arrived at said downstream workstation to an average of current workload arrived at all of said downstream workstations.

6. The method of claim 1, wherein said method further comprises the step of determining said feedback factor by comparing the current workload sent to said downstream workstation to an average workload sent to said downstream workstation.

7. The method of claim 1, wherein said method further comprises said steps of partitioning said job queue, determining said priority score, and selecting a next category from said job categories, and wherein said steps are performed using a scheduling computer programmed to perform said steps and in communication with control signals of said multi-task workstation.

8. The method of claim 1, wherein said selecting step includes the step of selecting a round robin scheme using said priority score.

9. A scheduling system for scheduling jobs of a manufacturing facility having at least one multi-task workstation having a work queue having jobs at different phases of manufacture for different downstream workstations, comprising:

a scheduler in communication with control signals of a multi-task machine, wherein said scheduler is a computer programmed to partition said jobs in a job queue of said multi-task workstation into job categories, such that each of said job categories represents said jobs at a comparable stage of manufacture and for the same downstream workstation, said scheduler determining a priority score for each of said job categories, which reflects feedback from a downstream workstation, said feedback reflecting a current workload of said downstream workstation, and said scheduler using said priority score to select said jobs from each of said categories;

a work monitor at each of said downstream workstations in communication with said scheduler, for maintaining workload history data of said downstream workstation and for determining current workload data of said downstream workstation, and for using said current workload data to send feedback data to said scheduler; and means for communicating data from said work monitor to said multi-task workstation.

10. The scheduling system of claim 9, wherein said scheduler further determines said priority score from a factor representing the percent of said jobs in each of said job categories.

11. The scheduling system of claim 9, wherein said scheduler further determines said priority score from a factor representing a flow position of said job category.

12. The method of claim 9, wherein said feedback is determined by comparing the current workload arrived at said downstream workstation to an average workload arrived at said downstream workstation.

13. The method of claim 9, wherein said feedback is determined by comparing an average workload arrived at said downstream workstation to an average workload arrived at all of said downstream workstations.

14. The method of claim 9, wherein said feedback is determined by comparing the current workload arrived at said downstream workstation to an average of the current workload arrived at all of said downstream workstations.

15. The method of claim 9, wherein said feedback is determined by comparing the current workload sent to said downstream workstation to the average workload sent to said downstream workstation.

16. A work monitor for providing feedback to a multi-task workstation including a work queue having jobs at different phases of manufacture for different downstream workstations, for the purpose of scheduling work to be processed by said multi-task workstation, comprising:

a computer programmed to maintain workload history data of each of said downstream workstations and to determine current workload data of said downstream workstation, and to make various comparisons of said workload history data of each of said downstream workstations, using said workload history data to determine feedback data;

memory for storing said workload history data; and output means for communicating said feedback data to a scheduler of said multi-task workstation.

17. The work monitor of claim 16, wherein said computer is programmed to compare a current workload arrived at said downstream workstation to an average workload arrived at said downstream workstation.

18. The work monitor of claim 16, wherein said computer is programmed to compare an average workload arrived at said downstream workstation to an average workload arrived at all of said downstream workstations.

19. The work monitor of claim 16, wherein said work monitor is programmed to compare a current workload arrived at said downstream workstation to an average workload arrived at said downstream workstation.

20. The work monitor of claim 16, wherein said work monitor is programmed for a plurality of said comparisons and is further programmed with a decision making algorithm for determining the effect of results of said comparisons on said feedback data.

21. A method for scheduling jobs of a manufacturing facility having at least one multi-task workstation including a work queue having jobs at different phases of manufacture and for different downstream workstations, comprising the steps of:

partitioning said jobs in a job queue of said multi-task workstation into job categories, such that each of said job categories represents said jobs at a comparable stage of said manufacture and for the same downstream workstation;

determining priority factors for each of said job categories at a predetermined periodic interval, said priority factors representing a flow position of said job category and feedback from a downstream workstation corresponding to a current workload of said downstream workstation;

determining a priority score for each of said categories in accordance with said priority factors; and selecting from each of said categories by using said priority score, jobs to be processed by said multi-task workstation.

* * * * *